United States Patent [19]

Gerteisen et al.

[11] 4,388,422

[45] Jun. 14, 1983

[54] FIBER-REINFORCED COMPOSITE MATERIALS

[75] Inventors: Steven R. Gerteisen; David R. Wetzel, both of Evansville, Ind.

[73] Assignee: Dart Industries Inc., Northbrook, Ill.

[21] Appl. No.: 30,253

[22] Filed: Apr. 16, 1979

[51] Int. Cl.³ .................. C08L 69/00; C08K 7/14; C08K 9/02
[52] U.S. Cl. .................. 523/137; 523/217; 524/611
[58] Field of Search ............ 428/388, 367; 260/37 M, 260/37 PC, 37 N, 40 R

[56] References Cited

U.S. PATENT DOCUMENTS

| 2,877,501 | 3/1959 | Brodt | 427/221 X |
| 2,901,455 | 8/1959 | Jurras | 260/37 M X |
| 3,042,570 | 7/1962 | Brodt | 264/174 X |
| 3,671,285 | 6/1972 | Prescott | 428/367 X |
| 3,746,662 | 7/1973 | Adelman | 260/37 M X |
| 3,778,334 | 12/1973 | Sturgeon | 428/367 X |
| 3,806,489 | 4/1974 | Rieux et al. | 260/37 PC X |

FOREIGN PATENT DOCUMENTS

| 33-4985 | 7/1958 | Japan | 260/37 M |
| 1336128 | 11/1973 | United Kingdom | 428/367 |
| 1397955 | 6/1975 | United Kingdom | 428/388 |

Primary Examiner—Lewis T. Jacobs
Assistant Examiner—Robert E. L. Sellers
Attorney, Agent, or Firm—Bryant W. Brennan; Leigh B. Taylor

[57] ABSTRACT

A composite plastic material having improved shielding against electromagnetic interference is provided by injection molding a molding compound comprising elongated granules obtained by incorporating into a thermoplastic resin matrix metallized glass fibers together with carbon fibers.

1 Claim, No Drawings

FIBER-REINFORCED COMPOSITE MATERIALS

BACKGROUND OF THE INVENTION

The use of plastic housings for electronic equipment and components is widely accepted in the automotive and electronic equipment fields today. However, the presently available plastic materials suffer from the disadvantage of being transparent or permeable to electromagnetic interference commonly known as, and referred to, as EMI. This drawback in available plastic materials is a matter of considerable concern in view of the susceptibility of electronic equipment to the adverse effects of EMI emission by the growing number of consumer products which produce such EMI signals, and to the increasing regulatory controls exercised over such electromagnetic pollution.

Currently, the major approach to solving plastic material shielding problems is through the application of metallic surface coatings to the molded plastic. Among such approaches are the use of vacuum deposition, metal foil linings, metal-filled spray coatings, zinc flame-spray and electric arc discharge. Each of these procedures is accompanied by one or more drawbacks with respect to cost, adhesion, scratch resistance, environmental resistance, the length of time required for application and the difficulties in adequately protecting many of the adverse geometrical forms in which the molded plastic must be provided.

More recently, attempts have been made to resolve the problem of EMI by formulation of composite plastic materials based upon the use of various fillers in thermoplastic matrices. However, none of the composite plastic products developed heretofore have proven completely satisfactory.

It is further noted that the addition of glass fibers and carbon fibers separately to resinous materials for the improvement of mechanical and physical properties is known in the field of reinforced plastic materials. Glass fibers have also been employed in compositions used in electrical applications, such as insulating enamels for electrical conductors. However, the use of glass fibers in such applications has been for the provision of physical properties such as resistance to plastic flow and to prevent abrasion of the enamel.

SUMMARY OF THE INVENTION

It has been found in accordance with the present invention that a composite product providing outstanding shielding against electromagnetic interferences is obtained by molding the reinforced thermoplastic resin composition obtained by incorporating into a thermoplastic resin matrix metallized glass fibers and carbon fibers.

The combination of these two fibrous materials with a thermoplastic resin enables the realization of a composite product with excellent electromagnetic interference shielding effectiveness. The composite products of the present invention are eminently suitable for use for shielding purposes in a wide variety of end use products such as radios, transmitters, computers and the like.

The composite comprising the thermoplastic resin, glass fibers and carbon fibers can be prepared according to procedures known to those skilled in the art. However, it has been found that the most advantageous properties are realized when such composites are prepared by the process of U.S. Pat. No. 2,877,501, the disclosure of which is incorporated herein by reference.

In the composite the fibers are commingled in the resin matrix and the resulting composition molded according to methods well known in the resin molding field. Preferably, however, the end products are prepared by injection molding and it is advantageous to employ this method of preparation for the achievement of optimum results.

DETAILED DESCRIPTION OF THE INVENTION

The fiber reinforced components can be advantageously prepared by what is known in the art as the "long glass" process, the resulting products being characterized in the art as "long fiber" products. The length of the majority of the fibers in these "long fiber" products will generally range well above the majority fiber length of the fibers in so-called "short fiber" products, which are normally in the range of about 0.01 inch to about 0.03 inch, and will generally extend the full length of the pieces themselves. This process generally involves the use of continuous lengths of filaments which are passed through a bath containing molten resin whereby such filaments become impregnated with the desired quantity of resin. Once the continuous filaments are impregnated they are continuously withdrawn from the bath, commingled, either before or after passage through a heat source, and cooled to solidify the molten resin around the commingled filaments of carbon fiber roving and metallized glass roving followed by a substantially transverse severing operation to form the short pieces. These pieces are similar to the pieces of the above described "short fiber" products in that the fibers extend substantially parallel to each other and substantially parallel to the axis defined by the direction in which the materials are withdrawn from the bath. However, contrary to the "short fiber" products, the fibers of the "long fiber" products extend substantially the entire distance from one severed side of the piece to the other severed side. Again, the "long fiber" product pieces may range from about 1/16 inch to about 1½ inch, preferably ⅛ inch to 1 inch. A process of this type is described in U.S. Pat. No. 3,042,570, the disclosure of which is incorporated by reference.

It is understood that rather than using a bath of molten resin in the above process the filaments may be impregnated with a resin suspension or emulsion and subsequently subjected to sufficient heat to dry and fuse the resin around the commingled filaments. Such a process is described in U.S. Pat. No. 2,877,501.

The filaments of carbon fiber roving and of metallized glass roving can be commingled or entwined either before or after the passage through the molten resin bath or resin suspension. However, it is preferred to pass the separate fibers through a common resin reservoir, thereafter commingling the separate coated strands, either before or after passage through a heat source.

In addition to the realization of outstanding electromagnetic shielding effectiveness, the combination of carbon fiber rovings and metallized glass fiber rovings provides a very material processing advantage. In processing a shielding compound composed of polycarbonate resin and metallized glass roving using the "long glass" process described above, one can encounter certain difficulties in maintaining a continuous process. The melt viscosity of the polycarbonate resin at the point where metallized glass roving is introduced can exert sufficient tension on the roving to cause rupture of the strand, thus disrupting a continuous coating process.

In processing the combination metallized glass and carbon fiber roving in accordance with the present invention, it was found that continuous process could be maintained despite the high melt viscosity of the polycarbonate. When a strand of carbon fiber roving is present with the metallized glass roving, a continuous coating process can be maintained despite the occasional rupture of the metallized glass. The non-ruptured carbon fiber strand maintains the coating process sufficiently to permit the physical re-combination of the metallized glass roving back into the coating operation in a relatively short period, thereby overcoming the previous difficulties occasioned by rupture of the metallized glass roving.

In the absence of the carbon fiber roving, a lengthy rethreading of the metallized glass roving through the resin reservoir is required when rupture occurs. The degree of the significance of the carbon fiber roving presence during processing with other polymers having higher or lower melt viscosities than polycarbonate will vary with the melt flow viscosity.

In both products, that is the "short fiber" products and "long fiber" products, the cross-sectional dimensions may vary considerably depending on several factors. With the "short fiber" products, which are formed by extruding strands, the cross-sectional dimension will depend upon the size of the extrusion orifice. With the "long fiber" products, which are formed by impregnating continuous lengths of filaments, the cross-sectional dimension will depend upon the total number of filaments being impregnated and gathered together and the amount of resin. There are, of course, certain practical limits on the cross-sectional dimensions of the pieces due to processing limitations. In general, it has been found most convenient to form pieces having nominal cross-sectional dimensions in the range of about 1/16 inch to about ¼ inch.

Elongated granules containing the commingled metallized glass fibers and carbon fibers in the thermoplastic resin matrix are prepared using one of the procedures described earlier in this application. After preparation of the elongated granules of metallized glass and of carbon fibers in thermoplastic resin, illustratively, in polycarbonate resin in both instances, the resulting composite is then molded in accordance with known procedures. Homogenization will be effected in the molding step.

The proportions of the components in the final blend can be varied over a range of total fiber reinforcement to resin of from about 10% to about 45%, with a preferred range of from about 15% to about 35%. Within this range, selection of the optimum proportion will be dependent on the end application or the particular objective sought. For optimum results, in some circumstances, it has been found that a proportion of fiber to resin of from 1 to 4 is most advantageous.

The proportion of metallized glass fiber to carbon fiber within the fiber reinforcing component can range from about 20% to about 80%, preferably from a range of from about 50% to about 80%. For optimum results, it has been found that a proportion of 3 parts of metallized glass fiber to about 1 part of carbon fibers is most effective.

It is, of course, possible to include conventional glass fiber, such as "E" glass fiber, in the composition as an extender. Similarly, other conventional fillers, pigments and the like may also be included.

It is also possible to prepare elongated granules separately containing metallized glass fibers and carbon fibers in the thermoplastic matrix using one of the procedures described earlier in this application. After the preparation of the elongated granules of metallized glass in thermoplastic resin and of carbon fibers in thermoplastic resin, illustratively in polycarbonate resin in both instances, a physical blend is made of these two types of fiber-reinforced plastic materials and the resulting blend is then molded in accordance with known procedures. No particular conditions are required for the preparation of the blend, simple physical mixing being sufficient. Homogenization of the blend will be effected in the molding step.

The reinforcing fibers employed according to the present invention are metallized glass fibers and carbon fibers. These fibers are commercially available in roving form and in chopped form. In the practice of the present invention, it has been found most advantageous to utilize both the metallized glass fibers and the carbon fibers in the form of rovings.

Thermoplastic resins in general may be employed in producing the reinforced resin component. Included among these resins are polyolefins, particularly polypropylene and copolymers of ethylene and propylene; polystyrene, styrene-acrylonitrile polymers, ABS polymers (polymers based on acrylonitrile-polybutadiene-styrene); nylons; particularly Nylon 6,6; polyphenylene oxides; polyphenylene oxide-polystyrene blends; polyphenylene sulfides; polyacetals; polysulfones; polycarbonates; polyurethanes; cellulose esters; polyesters such as polyethylene terephthalate; polymonochlorostyrene; acrylic polymers; polyvinyl chlorides; polyvinylidene chlorides; copolymers of vinyl-chloride and vinylidene chloride, various thermoplastic elastomers such as those based on styrene and butadiene or ethylene or propylene; and blends of any of the foregoing resins.

In processing the composite material of this invention, the mixture is fed in the normal manner to a feed hopper of the injection molding equipment. Thereafter, the mixture is processed through the equipment in the usual manner at temperature condition which render the resin molten and flowable.

The following examples illustrate the present invention but are not to be construed as limiting the scope thereof.

EXAMPLE I

Elongated granules containing 25% of aluminized glass alloy fiber roving in polycarbonate resin is admixed with elongated granules containing 21% of carbon fiber roving in polycarbonate resin, employed a blend ratio of 75 parts of aluminized glass product to 25 parts of carbon fiber product. The resulting blend contains about 5.25% of carbon fiber and about 18.75% of aluminized glass fiber.

The above admixed composition is fed to a screw-type injection molding machine. The composition is processed in the machine at temperatures in the range of 500° to 580° F., providing a molded product having desirable uniformity of appearance and good physical properties.

For purposes of comparison, elongated granules containing 25% of aluminized alloy coated glass fiber roving in polycarbonate resin is processed under identical conditions and the molded product obtained is tested against the product containing the combination of aluminized glass and carbon fibers for EMI shielding effectiveness. The results of this comparative testing are set forth in Table I below.

TABLE I

| Frequency Range | 12 | 20 | 30 | 50 | 70 | 100 | Megaherz |
|---|---|---|---|---|---|---|---|
| A | 18 | 18 | 18 | 19 | 22 | 28 | DB's |
| B | 27 | 27 | 27 | 28 | 30 | 35 | DB's |

A — aluminized glass fiber alone
B — aluminized glass/carbon fiber combination

EXAMPLE II

Compositions are prepared containing, respectively, (1) 5% carbon fiber, (2) 15% aluminized glass-fiber, and (3) a combination of 5% carbon fiber and 15% aluminized glass fiber all in a matrix of polycarbonate resin.

The compositions are injected molded according to the procedure employed in Example I and the resulting products tested for EMI shielding effectiveness. The results obtained are set forth in Table II below.

TABLE II

| Sample | Attenuation (dB) | | | |
|---|---|---|---|---|
|  | 100Mhz | 500Mhz | 1000Mhz | 2000Mhz |
| A (1) above | 1 | 5 | 8 | 10 |
| B (2) above | <½ | 2 |  |  |
| C (3) above | 4 | 10 | 14 | 15 |

While carbon fibers derived from the pyrolysis of organic fibers such as rayon or polyacrylonitrile, i.e. carbon fibers available under the trade-mark PAN, and aluminized alloy glass fibers and aluminized glass fibers were employed in the above examples, carbon fibers derived from a pitch precursor and metallized glass fibers where the metal can be other than aluminum, illustratively nickel, zinc or chromium can be employed in place of the specific material recited in the illustrative examples.

We claim:

1. A fiber reinforced thermoplastic resin composition of improved shielding effectiveness against electromagnetic interference comprising a polycarbonate resin having incorporated therein a commingled fiber constituent comprised of aluminized glass fibers and carbon fibers, wherein the fiber component and the resin component are present over a range of fiber to resin of from about 10% to about 45% and wherein the aluminized glass fiber and the carbon fiber are present over a range of aluminized glass fiber to carbon fiber of from about 20% to about 80%.

* * * * *